United States Patent
Kwak et al.

(10) Patent No.: US 8,711,308 B2
(45) Date of Patent: Apr. 29, 2014

(54) FLAT PANEL DISPLAY DEVICE AND METHOD OF FABRICATING THE SAME

(75) Inventors: Noh-Min Kwak, Yongin (KR); Dai-Han Cho, Yongin (KR); Gi-Na Yoo, Yongin (KR); Min-Jae Kim, Yongin (KR); Jeong-No Lee, Yongin (KR); Woo-Suk Jung, Yongin (KR); Duk-Jin Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 358 days.

(21) Appl. No.: 12/588,803

(22) Filed: Oct. 28, 2009

(65) Prior Publication Data

US 2010/0103599 A1    Apr. 29, 2010

(30) Foreign Application Priority Data

Oct. 28, 2008  (KR) .................. 10-2008-0105943
Oct. 28, 2008  (KR) .................. 10-2008-0105944

(51) Int. Cl.
*G02F 1/1333*    (2006.01)

(52) U.S. Cl.
USPC ...... 349/122; 349/130; 349/141; 361/679.01; 361/106; 174/250; 174/260; 313/500; 313/506; 428/192

(58) Field of Classification Search
USPC .................. 174/250, 260; 361/105, 679.01; 313/500, 506; 428/192; 349/130, 141, 349/122
See application file for complete search history.

(56) References Cited

U.S. PATENT DOCUMENTS

| | | | | |
|---|---|---|---|---|
| 5,501,900 | A | * | 3/1996 | Harada et al. .................. 428/323 |
| 5,725,407 | A | * | 3/1998 | Liu et al. .......................... 445/52 |
| 5,909,081 | A | * | 6/1999 | Eida et al. ...................... 313/504 |
| 6,020,867 | A | * | 2/2000 | Shimada et al. ................. 345/87 |
| 6,361,389 | B1 | * | 3/2002 | Hogue et al. ..................... 445/24 |
| 6,642,664 | B2 | | 11/2003 | Den Engelsen et al. |
| 6,654,083 | B1 | * | 11/2003 | Toda et al. ..................... 349/110 |

(Continued)

FOREIGN PATENT DOCUMENTS

| | | | | |
|---|---|---|---|---|
| JP | 2000206520 | A | * 7/2000 | ............ G02F 1/1335 |
| JP | 2002259053 | A | 9/2002 | |

(Continued)

*Primary Examiner* — Jinhee Lee
*Assistant Examiner* — James Wu
(74) *Attorney, Agent, or Firm* — Robert E. Bushnell, Esq.

(57) ABSTRACT

Provided are a flat panel display device including a protection board configured to prevent damage of a display panel from external impact, and a method of fabricating the same. The display panel and the protection board are closely attached, and distortion of an image displayed on the display panel due to a space between the display panel and the protection board can be prevented. The flat panel display device includes a display panel including a lower substrate, an upper substrate and at least one light emitting element disposed between the lower and upper substrates, a protection board disposed on the display panel, and an adhesive layer disposed between the display panel and the protection board. The method includes preparing a display panel including a lower substrate, an upper substrate and at least one light emitting element disposed between the lower and upper substrates, preparing a protection board, forming an adhesive layer on one surface of the display panel or the protection board, arranging the display panel and the protection board such that the adhesive layer is disposed between the display panel and the protection board, and applying a predetermined pressure to attach the display panel to the protection board.

20 Claims, 4 Drawing Sheets

(56) References Cited

U.S. PATENT DOCUMENTS

| | | | |
|---|---|---|---|
| 7,106,409 B2 * | 9/2006 | Matsuoka | 349/190 |
| 2003/0103180 A1 * | 6/2003 | Masuda et al. | 349/117 |
| 2003/0173891 A1 | 9/2003 | Chiba et al. | |
| 2004/0070342 A1 * | 4/2004 | Watanabe et al. | 313/586 |
| 2005/0194896 A1 * | 9/2005 | Sugita et al. | 313/506 |
| 2006/0110608 A1 * | 5/2006 | Azumi et al. | 428/441 |
| 2006/0125387 A1 * | 6/2006 | Adachi et al. | 313/506 |
| 2006/0139271 A1 * | 6/2006 | Okuda | 345/88 |
| 2006/0232523 A1 * | 10/2006 | Hori et al. | 345/76 |
| 2007/0108900 A1 | 5/2007 | Boek et al. | |
| 2007/0184292 A1 | 8/2007 | Lee et al. | |
| 2008/0043490 A1 * | 2/2008 | Coleman et al. | 362/623 |
| 2008/0137272 A1 * | 6/2008 | Cheng et al. | 361/681 |
| 2008/0180016 A1 * | 7/2008 | Oishi et al. | 313/112 |
| 2008/0224153 A1 * | 9/2008 | Tomoda | 257/88 |
| 2008/0261057 A1 * | 10/2008 | Slobodin | 428/447 |
| 2009/0011197 A1 | 1/2009 | Matsuhira | |
| 2009/0040772 A1 * | 2/2009 | Laney | 362/353 |
| 2010/0043965 A1 * | 2/2010 | Kamiya et al. | 156/275.5 |
| 2010/0157216 A1 * | 6/2010 | Wada | 349/122 |
| 2011/0075091 A1 * | 3/2011 | Tannas | 349/187 |

FOREIGN PATENT DOCUMENTS

| | | | |
|---|---|---|---|
| JP | 2002-303728 | | 10/2002 |
| JP | 2002-372928 | | 12/2002 |
| JP | 2003029645 A | | 1/2003 |
| JP | 2003-240907 A | | 8/2003 |
| JP | 2004206078 A | | 7/2004 |
| JP | 2004272059 A | | 9/2004 |
| JP | 2006156150 A | | 6/2006 |
| JP | 2008259049 A | | 9/2006 |
| JP | 2006290960 A | | 10/2006 |
| JP | 2007-108553 | | 4/2007 |
| JP | 2007-134284 | | 5/2007 |
| JP | 2007-164154 | | 6/2007 |
| JP | WO2008/123611 | * | 10/2008 |
| KR | 10-2003-0044565 | | 6/2003 |
| KR | 10-0442240 | | 7/2004 |
| KR | 10-0657403 | | 12/2006 |
| KR | 10-0659528 | | 12/2006 |
| KR | 10-0682962 | | 2/2007 |
| KR | 10-2007-0090262 | | 9/2007 |
| KR | 10-0820524 | | 4/2008 |
| KR | 2008-0059512 | | 6/2008 |
| KR | 20080048996 A | | 6/2008 |
| KR | 1020080091001 A | | 10/2008 |
| WO | 2008093704 A1 | | 8/2008 |
| WO | 2008/126856 | | 10/2008 |
| WO | 2008123611 A1 | | 10/2008 |

* cited by examiner

FLAT PANEL DISPLAY DEVICE AND METHOD OF FABRICATING THE SAME

CLAIM OF PRIORITY

This application makes reference to, incorporates the same herein, and claims all benefits accruing under 35 U.S.C. §119 from applications earlier filed in the Korean Intellectual Property Office on 28 Oct. 2008 and there duly assigned Serial No. 10-2008-0105943, and on 28 Oct. 2008 and there duly assigned Serial No. 10-2008-0105944.

BACKGROUND OF THE INVENTION

1. Field of the Invention

The present invention relates to a flat panel display device including a protection board to prevent damage of a display panel from external impact, and more particularly, to a flat panel display device, in which a display panel and a protection board are closely attached, and a space between the display panel and the protection board results in preventing distortion of an image displayed on the display panel, and a method of fabricating the same.

2. Description of the Related Art

Flat panel display devices are used as substitutes for cathode-ray tube display devices due to light weight and thin thickness. Such flat panel display devices include liquid crystal display (LCD) devices and organic light emitting diode (OLED) display devices. Among them, an OLED display device emits light of a specific wavelength due to energy generated from an exciton, which is formed by recombination of an electron and a hole injected to an organic thin film including at least one emission layer through a cathode and an anode in the emission layer. Compared to an LCD device, an OLED display device has excellent brightness and a wide viewing angle, and does not need a backlight unit, thereby being formed in a very slim shape.

In order to prevent damage of a light emitting device such as an OLED including at least one emission layer or a display panel from external impact, in the flat panel display device, the display panel is accommodated in a bezel having one open side, and then a protection board is disposed at the open portion of the bezel or both the display panel and the protection board are accommodated in the bezel.

However, when a protection board is disposed on a display panel as mentioned above, the protection board is made of a transparent material such as glass and is attached to the display panel along their edges to prevent a decrease in brightness of an image displayed on the display panel. Thus, the display panel and the protection board are not sufficiently attached, and thus the image displayed on the display panel may be distorted due to an empty space between the display panel and the protection board and a difference in refractive index between an upper substrate of the display panel and the protection board.

Alternatively, when a black matrix and a protection board are disposed on a display panel, a surface step difference of the display panel or the protection board caused by the black matrix results in bubbles made when the adhesion of the display panel to the protection board, and thus an upper substrate of the display panel and the protection board may not be closely attached.

SUMMARY OF THE INVENTION

Aspects of the present invention provide a flat panel display device in which a display panel and a protection board are more closely attached to each other than in the conventional device, thereby reducing an empty space therebetween, is provided.

According to an embodiment of the present invention, a flat panel display device includes a display panel including a lower substrate, an upper substrate and at least one light emitting element disposed between the lower and upper substrates, a protection board disposed on the display panel, and an adhesive layer disposed between the display panel and the protection board. The display panel displays an image.

The adhesive layer may have a refractive index between a refractive index of the upper substrate and a refractive index of the protection board.

The flat panel display device may further include a bezel configured to prevent damage of the display panel from external impact. The image may be displayed on an upper surface of the display panel, the protection board may be disposed on the upper surface of the display panel, and the bezel may surround both side surfaces of the display panel and a lower surface of the display panel.

The protection board may have a larger area than the display panel, and the adhesive layer may be disposed between the bezel and the protection board.

According to another example of the present invention, a method of fabricating a flat panel display device includes preparing a display panel including a lower substrate, an upper substrate and at least one light emitting element disposed between the lower and upper substrates, preparing a protection board, forming an adhesive layer on one surface of the display panel or the protection board, arranging the display panel and the protection board such that the adhesive layer is disposed between the display panel and the protection board, and applying a predetermined pressure to attach the display panel to the protection board.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
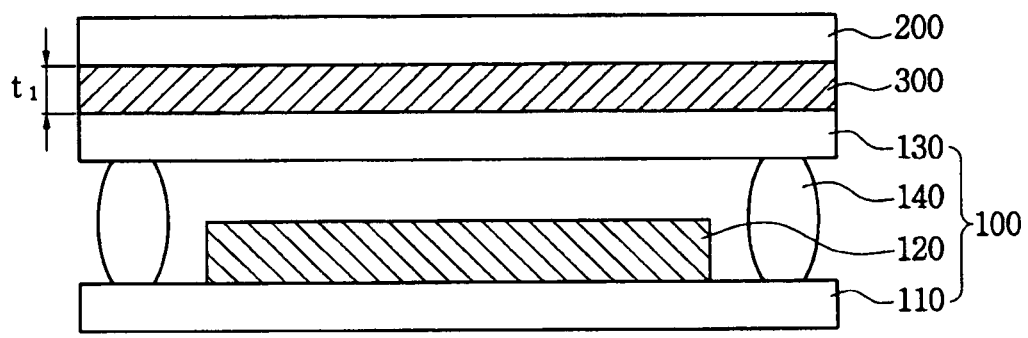
FIG. 1 is a cross-sectional view of a flat panel display device according to a first example embodiment of the present invention.

Reference will now be made in detail to the present examples of the present invention, examples of which are illustrated in the accompanying drawings. In the drawings, lengths and thicknesses of layers and regions may be exaggerated for convenience, and like numerals denote the like elements throughout the specifications.

FIG. 1 is a cross-sectional view of a flat panel display device according to a first example embodiment of the present invention.

Referring to FIG. 1, the flat panel display device according to a first example embodiment of the present invention includes a display panel 100 having a lower substrate 110, an upper substrate 130 and at least one light emitting element 120 disposed between the lower substrate 110 and the upper substrate 130, a protection board 200 disposed on the display panel 100, and an adhesive layer 300 disposed between the display panel 100 and the protection board 200 and having a first thickness t1. Specifically, the adhesive layer 300 is disposed between the protection board 200 and the upper substrate 130. The adhesive layer 300 fills substantially the entire space between the protection board 200 and the upper substrate 130. Here, the light emitting element 120 may be an organic light emitting diode having at least one emission layer, and in the display panel 100, the lower substrate 110 and the upper substrate 130 are bonded to each other by a sealing member 140 such as a sealant to prevent deterioration of the organic light emitting diode due to external humidity or moisture.

The adhesive layer 300 is used to attach the display panel 100 to the protection board 200. When the first thickness t1 of the adhesive layer 300 is smaller than 10 μm, the display panel 100 and the protection board 200 are not sufficiently attached together, and when the first thickness t1 of the adhesive layer 300 is larger than 500 μm, a path of an image displayed on the display panel 100 may become longer, resulting in decreases in brightness and visibility. Thus, the first thickness t1 of the adhesive layer 300 may range from 10 to 500 μm.

In order to prevent distortion of the image displayed by the light emitting element 120 due to a difference in refractive index between the upper substrate 130 of the display panel 100 and the adhesive layer 300 or between the adhesive layer 300 and the protection board 200, the refractive index of the adhesive layer 300 may be between that of the upper substrate 130 and that of the protection board 200. Generally, since the upper substrate 130 has a refractive index ranging from 1.4 to 1.5, and the protection board 200 has a refractive index ranging from 1.45 to 1.5, the adhesive layer 300 may have a refractive index ranging from 1.45 to 1.5.

In addition, for stronger adhesion between the display panel 100 and the protection board 200, the adhesive layer 300 may be formed of a UV curing polymer, and preferably, an acrylic resin having a refractive index of 1.467 or a silicon-based resin having a refractive index ranging from 1.4 to 1.51.

Figure 2A:
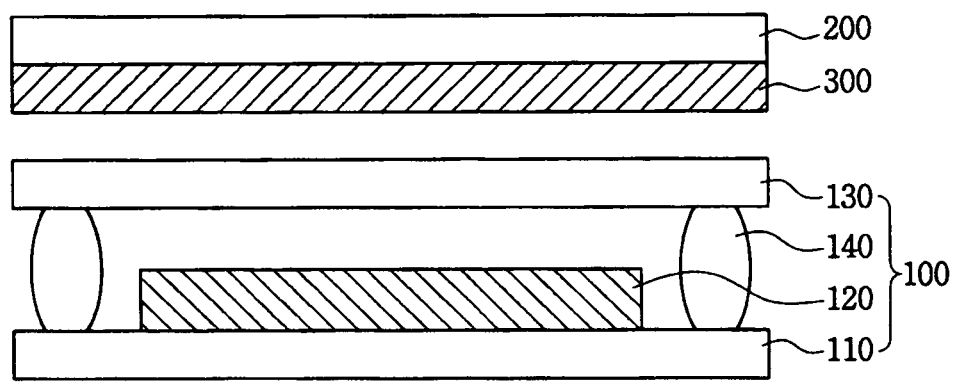
FIGS. 2A to 2B are cross-sectional views illustrating a method of fabricating the flat panel display device according to a first example embodiment of the present invention.
Figure 2B:
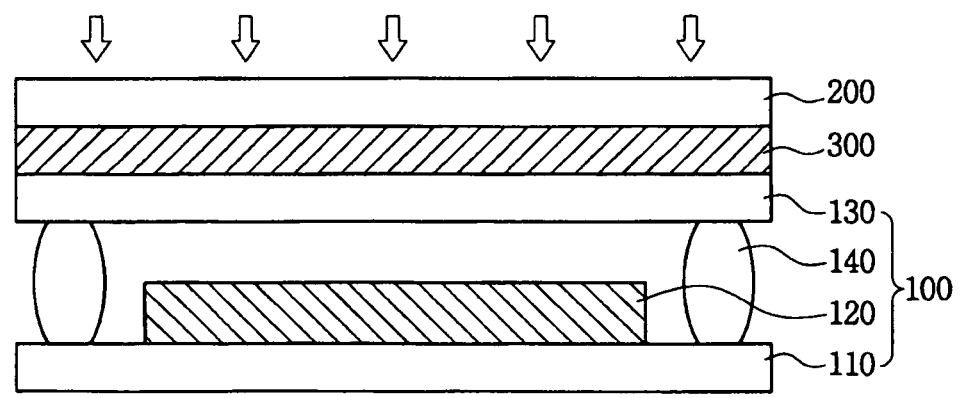

FIGS. 2A and 2B are cross-sectional views illustrating a method of fabricating the flat panel display device according to a first example embodiment of the present invention.

Referring to FIG. 2A, an adhesive layer 300 is formed on one surface of a protection board 200, and then the protection board 200 is arranged to allow the surface, on which the adhesive layer 300 is formed, to face the display panel 100. Here, in this embodiment of the present invention, the adhesive layer 300 is formed on one surface of the protection board 200, but the adhesive layer may be formed on one surface of the display panel 100 rather than the surface of the protection board 200, and then the display panel 100 may be arranged to allow the surface on which the adhesive layer 300 is formed to face the protection board 200.

As shown in FIG. 2B, the surface of the display panel 100 is in contact with the adhesive layer 300 on the protection board 200, and a predetermined pressure is applied to the other surface of the protection board 200 to attach them together. While, in the first example embodiment of the present invention, the predetermined pressure is applied to the other surface of the protection substrate 200, the pressure may be applied to a surface of the display panel 100 which is not in contact with the adhesive layer 300, or may be applied to both the display panel 100 and the protection board 200.

The predetermined pressure is applied to prevent generation of bubbles in the adhesive layer 300 during adhesion of the display panel 100 to the protection board 200. When the applied pressure is less than $2.5 \times 10^5$ Pa, the display panel 100 and the protection board 200 may not be closely attached, thereby not preventing the generation of bubbles in the adhesive layer 300. On the contrary, when the applied pressure is more than $2 \times 10^6$ Pa, the lower and upper substrates of the display panel and the protection board may be damaged. Accordingly, the preferable pressure ranges from $2.5 \times 10^5$ Pa to $2 \times 10^6$ Pa.

To prevent the generation of bubbles in the adhesive layer 300 during adhesion of the display panel 100 to the protection board 200, surroundings of the display panel 100 and the protection board 200 may be maintained at a predetermined temperature. When the temperature around the display panel 100 and the protection board 200 is higher than 90° C., the light emitting element 120 in the display panel 100 may deteriorate. Accordingly, the temperature around the display panel 100 and the protection board 200 may be maintained at 90° C. or less.

Figure 3:
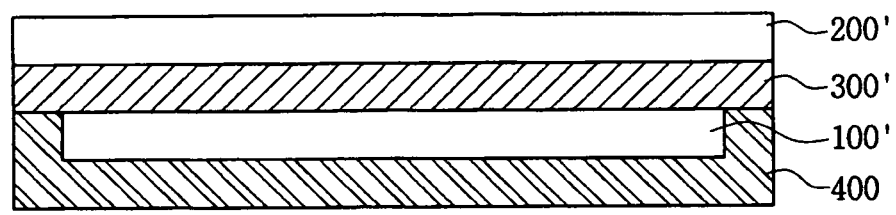
FIG. 3 is a cross-sectional view of a flat panel display device according to a second example embodiment of the present invention.

FIG. 3 is a cross-sectional view of a flat panel display device according to a second example embodiment of the present invention.

Referring to FIG. 3, the flat panel display device according to a second example embodiment of the present invention includes a display panel 100', a protection board 200' disposed on the display panel 100', an adhesive layer 300' disposed between the display panel 100' and the protection board 200', and a bezel 400 configured to accommodate the display panel 100'. In the second example embodiment of the present invention, the display panel 100', the protection board 200' and the adhesive layer 300' are configured in the same manner as those of the flat panel display device according to the first example embodiment of the present invention. Accordingly, descriptions of these components will be omitted.

The bezel 400 protects the display panel 100' from external impact, which has the same function as the protection board 200', but since the bezel is disposed in a surface where an image is not displayed on the display panel 100', it is not necessarily formed of a transparent material, unlike the protection board 200'.

The bezel 400 may accommodate both the display panel 100' and the protection board 200' attached through the adhesive layer 300'. However, in this case, a special configuration to bond the protection board 200' and the bezel 400 is needed. For this reason, the bezel 400 may accommodate only the display panel 100', and the display panel 100' and the bezel 400 may be attached to the protection board 200' through the adhesive layer 300'. Here, as shown in FIG. 3, it is more preferable that the protection board 200' is made larger than the display panel 100' to allow both of the display panel 100' and the bezel 400 to be attached to the protection board 200', FIG. 4 is a plan view of a flat panel display device according to a third example embodiment of the present invention, and FIG. 5 is a cross-sectional view taken along line I-I' of FIG. 4.

Figure 4:
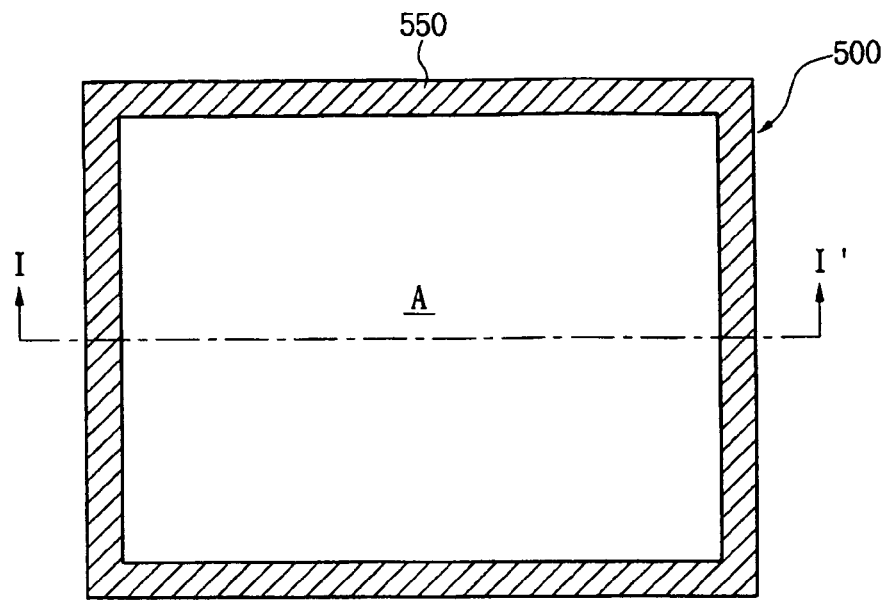
FIG. 4 is a plan view of a flat panel display device according to a third example embodiment of the present invention.
Figure 5:
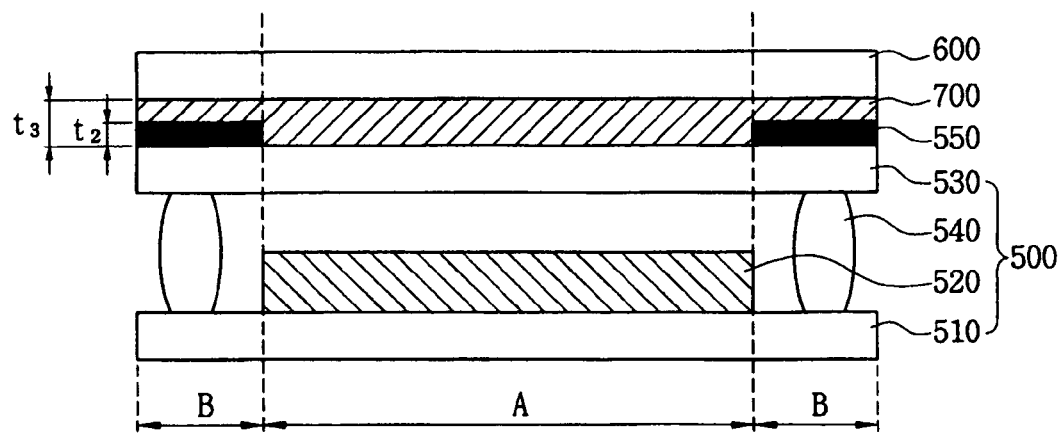
FIG. 5 is a cross-sectional view taken along line I-I' of FIG. 4.

Referring to FIGS. 4 and 5, the flat penal display device according to a third example embodiment of the present invention includes a display panel 500 having a lower substrate 510, an upper substrate 530 and at least one light emitting element 520 disposed therebetween, a black matrix 550 disposed on an edge of the display panel 500 and having a second thickness t2, a protection board 600 disposed on the display panel 500 and the black matrix 550, and an adhesive layer 700 disposed between the display panel 500 and the protection board 600 and having a third thickness t3. Here, the light emitting element 520 may be an organic light emitting diode including at least one emission layer, and in this case, the lower and upper substrates 510 and 530 of the display panel 500 are bonded to each other by a sealing member 540 such as a sealant to prevent deterioration of the organic light emitting diode due to external humidity or moisture.

The black matrix 550 is to improve a contrast ratio of an image displayed by the emission device 520 of the display panel 500, so that it can be disposed on a non-display region B of the display panel 500, which is excluded from a display region A of the display panel 500 having the light emitting element 520. As shown in FIG. 5, it is preferable that the black matrix 550 is disposed on the display panel 500 at a position corresponding to the sealing member 540 bonding the lower and upper substrates 510 and 530 of the display panel 500 to each other.

As shown in FIG. 5, the black matrix 550 is in contact with a top surface of the display panel 500 along an edge of the display panel 500. The black matrix 550 may be in contact with a bottom surface of the protection board 600 along an edge of the protection board 600.

The adhesive layer 700 is configured to attach the display panel 500 to the protection board 600. The adhesive layer 700 may be formed to a third thickness t3 larger than the second thickness t2 or be formed to a thickness equal to the second thickness t2 of the black matrix 550 to prevent a step difference on the top surface of the display panel 500 caused by the black matrix 550 disposed on the display panel 500. Here, when the third thickness t3 of the adhesive layer 700 is equal to the second thickness t2 of the black matrix 550, the display panel 500 in contact with the black matrix 550 and the protection board 600 may not be closely attached to each other. Accordingly, the third thickness t3 of the adhesive layer 700 may be formed larger than the second thickness t2 of the black matrix 550 to allow a part of the adhesive layer 700 to be inserted between the black matrix 550 and the display panel 500 or the protection board 600 due to an adhesion pressure of the display panel 500 and the protection board 600 during adhesion of the display panel 500 to the protection board 600, so that the display panel 500 can sufficiently adhere to the protection board 600.

Generally, since the second thickness t2 of the black matrix 550 ranges from 20 to 40 μm, the third thickness t3 of the adhesive layer may be 20 μm or more. As the third thickness t3 of the adhesive layer becomes larger, a gap between the display panel 500 and the protection board 600 becomes bigger, an overall thickness of the flat panel display device is increased, and a transfer path of the image displayed by the light emitting element 520 also becomes longer, resulting in a reduction in brightness. Thus, the third thickness t3 of the adhesive layer 700 is preferably in a range from 500 μm or less.

In order to prevent distortion of the image displayed by the light emitting element 520 due to a difference in refractive index between the upper substrate 530 of the display panel 500 and the adhesive layer 700 or between the adhesive layer 700 and the protection board 600, the adhesive layer 700 may have a refractive index between that of the upper substrate 530 and that of the protection board 600. Considering that the upper substrate 530 generally has a refractive index ranging from 1.4 to 1.5, and the protection board 600 has a refractive index ranging from 1.45 to 1.5, the refractive index of the adhesive layer 700 preferably has a refractive index ranging from 1.45 to 1.5. Here, among common adhesive bonding members, an acrylic resin has a refractive index of 1.467, and a silicon-based resin has a refractive index ranging from 1.4 to 1.51. Accordingly, the adhesive layer 700 may be formed of an acrylic resin or silicon-based resin.

As a result, when a bezel is included in a flat panel display device according to an example embodiment of the present invention to prevent damage of all surfaces between a display panel and a protection board or a display panel from external impact, an adhesive layer is disposed on all the surface between the bezel, the display panel and the protection board, thereby reducing an empty space between the display panel and the protection board and making the display panel closely adhering to the protection board. In addition, a refractive index of the adhesive layer is set between that of an upper substrate of the display panel and that of the protection board, and a predetermined pressure is applied to the display panel and the protection board during adhesion of the display panel to the protection board using the adhesive layer, thereby preventing generation of bubbles in the adhesive layer. Thus, distortion of an images displayed on the display panel due to the adhesive layer can be prevented.

Alternatively, the flat panel display device according to the present invention includes an adhesive layer having a thickness equal to or larger than that of a black matrix between the display panel on which the black matrix is disposed along an edge, and the protection board. Thus, a surface step difference between the display panel and the protection board can be minimized, and the display panel can more closely adhere to the protection board.

Although a few examples of the present invention have been shown and described, it would be appreciated by those skilled in the art that changes may be made in this example without departing from the principles and spirit of the invention, the scope of which is defined in the claims and their equivalents.

What is claimed is:

1. A flat panel display device, comprising:
   a display panel for displaying an image, the display panel including a lower substrate, an upper substrate and at least one light emitting element disposed between the lower and upper substrates;
   a protection board disposed on the display panel;
   an adhesive layer disposed between the display panel and the protection board; and
   a black matrix disposed between the display panel and the adhesive layer, the display panel including a display region where the light emitting element is formed and a non-display region where no light emitting element is formed, the black matrix being disposed on the non-display region of the display panel and having a thickness equal to or smaller than a thickness of the adhesive layer, the black matrix disposed on a peripheral edge of the display panel.

2. The device according to claim 1, wherein the adhesive layer has a refractive index between a refractive index of the upper substrate and a refractive index of the protection board, the upper substrate being disposed closer to the protection board than the lower substrate.

3. The device according to claim 2, wherein the adhesive layer has a refractive index ranging from 1.45 to 1.5.

4. The device according to claim 1, wherein the adhesive layer has a thickness ranging from 10 micro-meters to 500 micro-meters.

5. The device according to claim 1, wherein the adhesive layer is formed of a UV-curing polymer.

6. The device according to claim 5, wherein the adhesive layer is formed of an acrylic or silicon-based resin.

7. The device according to claim 1, further comprising:
a bezel configured to prevent damage of the display panel from external impact.

8. The device according to claim 7, wherein the image is displayed on an upper surface of the display panel, which faces the protection board.

9. The device according to claim 8, wherein the protection board has a larger area than the display panel, and the adhesive layer is disposed between the bezel and the protection board.

10. The device according to claim 1, wherein the black matrix has a thickness ranging from 20 micro-meters to 40 micro-meters.

11. A method of fabricating a flat panel display device, comprising:
preparing a display panel including a lower substrate, an upper substrate and at least one light emitting element disposed between the lower and upper substrates, the display panel displaying an image;
preparing a protection board;
forming an adhesive layer on a surface of the display panel or a surface of the protection board; and
arranging the display panel and the protection board such that the adhesive layer is disposed between the display panel and the protection board; and applying a predetermined pressure to attach the display panel to the protection board, a black matrix formed between the display panel and the adhesive layer, the display panel including a display region where the light emitting element is formed and a non-display region where no light emitting element is formed, the black matrix being disposed on the non-display region of the display panel and having a thickness equal to or smaller than a thickness of the adhesive layer, the black matrix disposed on a peripheral edge of the display panel.

12. The method according to claim 11, wherein the adhesive layer has a refractive index between a refractive index of the upper substrate and a refractive index of the protection board, the upper substrate being disposed closer to the protection board than the lower substrate.

13. The method according to claim 12, wherein the adhesive layer has a refractive index ranging from 1.45 to 1.5.

14. The method according to claim 11, wherein the adhesive layer is formed to a thickness of 10 micro-meters to 500 micro-meters.

15. The method according to claim 11, wherein the adhesive layer is formed of an acrylic or silicon-based resin.

16. The method according to claim 11, further comprising accommodating the display panel in a bezel having an open side, wherein the step of preparing the protection board including preparing the protection board larger than the display panel so that both of the bezel and the display panel are attached to the protection board.

17. The method according to claim 11, wherein the predetermined pressure ranges from $2.5 \times 10^5$ Pa to $2 \times 10^6$ Pa.

18. The method according to claim 11, further comprising:
maintaining the display panel and the protection board at a predetermined temperature during adhesion of the display panel to the protection board.

19. The device according to claim 1, wherein the black matrix directly contacts the adhesive layer.

20. The method according to claim 11, wherein the black matrix directly contacts the adhesive layer.

* * * * *